United States Patent
Gardner et al.

[19]

[11] Patent Number: 6,160,316
[45] Date of Patent: Dec. 12, 2000

[54] INTEGRATED CIRCUIT UTILIZING AN AIR GAP TO REDUCE CAPACITANCE BETWEEN ADJACENT METAL LINEWIDTHS

[75] Inventors: Mark I. Gardner, Cedar Creek; Thomas E. Spikes, Round Rock; Robert Paiz, Austin, all of Tex.

[73] Assignee: Advanced Micro Devices, Inc., Sunnyvale, Calif.

[21] Appl. No.: 09/034,633

[22] Filed: Mar. 4, 1998

[51] Int. Cl.$^7$ ...................................................... H01L 29/72
[52] U.S. Cl. ........................ 257/773; 257/735; 257/775; 257/776
[58] Field of Search .................... 257/773, 775, 257/776, 735

[56] References Cited

U.S. PATENT DOCUMENTS

| | | |
|---|---|---|
| 4,182,023 | 1/1980 | Cohen et al. . |
| 4,675,074 | 6/1987 | Wada et al. . |
| 4,681,655 | 7/1987 | Potter . |
| 4,899,439 | 2/1990 | Potter et al. . |
| 4,920,639 | 5/1990 | Yee . |
| 5,000,818 | 3/1991 | Thomas et al. . |
| 5,001,079 | 3/1991 | Van Laarhoven et al. . |
| 5,117,276 | 5/1992 | Thomas et al. . |
| 5,141,896 | 8/1992 | Katoh . |
| 5,182,225 | 1/1993 | Matthews . |
| 5,217,926 | 6/1993 | Langley . |
| 5,241,193 | 8/1993 | Pfiester et al. . |
| 5,272,100 | 12/1993 | Satoh . |
| 5,310,700 | 5/1994 | Lien et al. . |
| 5,324,683 | 6/1994 | Fitch et al. . |
| 5,386,142 | 1/1995 | Kurtz et al. . |
| 5,393,709 | 2/1995 | Lur et al. . |
| 5,407,860 | 4/1995 | Stoltz et al. . |
| 5,413,962 | 5/1995 | Lur et al. . |
| 5,426,072 | 6/1995 | Finnila . |
| 5,444,015 | 8/1995 | Aitken et al. . |
| 5,451,804 | 9/1995 | Lur et al. . |
| 5,462,884 | 10/1995 | Taniguchi . |
| 5,488,015 | 1/1996 | Havemann et al. . |
| 5,498,571 | 3/1996 | Mori et al. . |
| 5,512,775 | 4/1996 | Cho . |
| 5,545,919 | 8/1996 | Ueda et al. . |
| 5,559,049 | 9/1996 | Cho . |
| 5,559,055 | 9/1996 | Chang et al. . |
| 5,567,982 | 10/1996 | Bartelink . |
| 5,641,712 | 6/1997 | Grivna et al. . |
| 5,646,067 | 7/1997 | Gaul . |
| 5,665,632 | 9/1997 | Lur et al. . |
| 5,710,079 | 1/1998 | Sukharev . |
| 5,716,861 | 2/1998 | Moslehi . |

(List continued on next page.)

FOREIGN PATENT DOCUMENTS

| | | | |
|---|---|---|---|
| 63-179548 | 7/1988 | Japan . | |
| 1-296641 | 11/1989 | Japan . | |
| 5-206120 | 8/1993 | Japan . | 257/276 |
| 5335475 | 12/1993 | Japan . | |

OTHER PUBLICATIONS

Wolf, "Silicon Processing for the VLSI Era—vol. 2," 1990 Ed., pp. 198.

*Primary Examiner*—Edward Wojciechowicz
*Attorney, Agent, or Firm*—Kevin L. Daffer; Conley, Rose & Tayon

[57] ABSTRACT

A method is provided for forming a multi-level interconnect in which capacitive coupling between laterally adjacent conductors employed by an integrated circuit is reduced. According to an embodiment, a conductor is dielectrically spaced above a semiconductor substrate, and a masking structure is arranged upon an upper surface of the conductor. Select portions of the conductor are removed such that opposed ends of the masking structure extend beyond opposed sidewall surfaces of the conductor. An interlevel dielectric is deposited to a level above the masking structure such that air gaps are formed laterally adjacent the opposed sidewall surfaces of the conductor, and the interlevel dielectric is planarized to a level spaced above an upper surface of the masking structure.

8 Claims, 2 Drawing Sheets

U.S. PATENT DOCUMENTS

| | | |
|---|---|---|
| 5,736,446 | 4/1998 | Wu . |
| 5,741,736 | 4/1998 | Orlowski . |
| 5,759,913 | 6/1998 | Fulford, Jr. et al. . |
| 5,770,507 | 6/1998 | Chen et al. . |
| 5,783,864 | 7/1998 | Dawson et al. . |
| 5,792,706 | 8/1998 | Michael et al. . |
| 5,814,555 | 9/1998 | Bandyopadhyay et al. . |
| 5,832,601 | 11/1998 | Eldridge et al. . |
| 5,847,464 | 12/1998 | Singh et al. . |
| 5,869,374 | 2/1999 | Wu . |
| 5,869,379 | 2/1999 | Gardner et al. . |
| 5,953,626 | 9/1999 | Hause et al. . |
| 5,959,337 | 9/1999 | Gardner et al. . |
| 5,998,293 | 12/1999 | Dawson et al. . |

INTEGRATED CIRCUIT UTILIZING AN AIR GAP TO REDUCE CAPACITANCE BETWEEN ADJACENT METAL LINEWIDTHS

BACKGROUND OF THE INVENTION

1. Field of the Invention

This invention relates to integrated circuit fabrication and, more particularly, to forming interconnects (i.e., conductors) with air gaps adjoining lateral surfaces of the interconnects to reduce capacitive coupling between adjacent interconnects employed by the integrated circuit.

2. Description of the Related Art

Fabrication of an integrated circuit involves numerous processing steps. After impurity regions have been deposited within a semiconductor substrate and gate areas defined upon the substrate, interconnect routing is placed on the semiconductor topography and connected to contact areas thereon to form an integrated circuit. Building multi-level interconnect structures is well known in the art. Multi-level interconnect structures were developed as a result of continued shrinking of active devices combined with increasing area required to accommodate single-level interconnect structures. In fact, the area required to route single-level interconnect lines became greater than the area occupied by the active devices. Multi-level interconnect lines are more popular than single-level interconnect lines since the area required by multi-level interconnect lines is shared by several levels.

The semiconductor industry has devoted much effort to reducing the feature sizes of and the separation between adjacent structures, such as conductive interconnects or transistors, in integrated circuits. Reducing the size of structures employed by integrated circuits has resulted in many advantages, including higher circuit speed and increased complexity. This reduction in size, however, and the commensurate increase in density, have also given rise to problems, such as unwanted capacitive coupling between adjacent structures on the integrated circuit device. A change in the voltage applied to a conductor produces a change in charge distribution within the conductor. As the separation between conductors decreases, the charge distribution within one conductor may cause charge segregation within an adjacent, second conductor even in the absence of an applied voltage across the second conductor. As a result, current may undesirably flow through the second conductor, giving rise to a false signal (e.g., a logic 1 instead of a logic 0). Consequently, improper operation or failure of the integrated circuit device employing the conductors may occur.

A dielectric material known as an "interlevel dielectric" is generally used to isolate conductors arranged within a unitary level of an integrated circuit from each other and from structures configured within other levels. Unfortunately, the relative permittivity of the interlevel dielectric somewhat limits the minimum capacitive coupling that can be achieved between adjacent conductors. The permittivity $\epsilon$ of a material reflects the ability of the material to be polarized by an electric field. The capacitance between two layers of a conductive material separated by a dielectric is directly proportional to the permittivity of the dielectric. Typically, the permittivity of a material is described as its permittivity normalized to that of a vacuum, $\epsilon_0$. The relative permittivity, or dielectric constant, $\kappa$, of a material is therefore defined as $$\kappa = \epsilon/\epsilon_0$$

Silicon dioxide, with a dielectric constant of about 3.7–3.8, is often used as the interlevel dielectric. Adding fluorine to silicon dioxide or using an organic compound as the dielectric may produce materials with a dielectric constant lower than the dielectric constant of silicon dioxide without fluorine. In some cases, however, this reduction is still insufficient to eliminate capacitive coupling.

It would therefore be desirable to develop a technique for fabricating an integrated circuit with reduced capacitive coupling between adjacent conductors. A change in charge distribution within a first conductor would be less likely to cause charge segregation within a second conductor laterally spaced from the first conductor. Thus, unwanted current flow through the second conductor to undesirable places of the integrated circuit would be less likely to occur. As such, the integrated circuit would be more likely to function according to design. Furthermore, it would be beneficial if feature sizes of the integrated circuit could be reduced without concern over unwanted capacitive coupling. Therefore, reducing lateral capacitive coupling within an integrated circuit would allow for increased integration density and reduced propagation delay.

SUMMARY OF THE INVENTION

The problems outlined above are in large part solved by the technique hereof for fabricating an integrated circuit in which air gaps are formed laterally adjacent the conductors employed by the integrated circuit. Because air has the lowest dielectric constant of any material ($\kappa$ equals approximately 1.0), the inclusion of air gaps between adjacent conductors reduces the capacitance between the conductors when a voltage is applied to one of the conductors. Minimizing capacitive coupling between conductors improves integrated circuit performance and reliability while allowing increased integration density.

According to one embodiment of the present invention, a semiconductor topography is provided which has an interlevel dielectric disposed thereon. The topography may include different features. For example, it may comprise a doped silicon-based substrate upon and within which transistors are arranged. A via having relatively vertical sidewalls may extend perpendicular to the topological surface of the substrate through the entire thickness of the interlevel dielectric. A conductive plug, such as tungsten, may be used to fill the via. A diffusion barrier, e.g., titanium nitride, may be configured between the sidewalls of the via and those of the conductive plug. The conductive plug surface may extend horizontally across the same elevational plane as the interlevel dielectric surface.

A conductive material may be deposited upon the dielectric surface and the conductive plug surface to form a first interconnect level of an integrated circuit. The conductive material may be a metal, such as aluminum. A masking layer, dissimilar in composition from the conductive material, may then be deposited across the conductive material. Select portions of the masking layer and the conductive material may then be removed to form a conductor underlying a masking structure and interposed between a pair of opposed sidewall surfaces. An isotropic etch technique highly selective to the conductor may be performed, reducing the lateral thickness (or width) of the conductor while leaving the masking structure as originally positioned. As a result, an "undercut" is formed beneath the masking structure laterally adjacent new opposed sidewall surfaces of the conductor. In an embodiment, formation of the conductor underlying the masking structure and formation of the undercut may be performed as sequential steps. In an alternative embodiment, formation of the undercut may be accomplished coincidentally with the process of forming the conductor and overlying masking structure.

An interlevel dielectric may then be deposited across the integrated circuit. Because opposite ends of the masking structure extend beyond the opposed sidewall surfaces of the underlying conductor, the interlevel dielectric is prevented from accumulating upon the sidewall surfaces of the conductor. As the dielectric is deposited, it strikes the masking structure and deposits thereon before reaching the conductor sidewall surfaces. As a result, air gaps are formed laterally adjacent the sidewall surfaces of the conductor between the conductor and the interlevel dielectric. A chemical mechanical polishing step may then be used to remove the interlevel dielectric from above the interconnect structures to form a substantially planar surface.

Air has the lowest dielectric constant of known materials. Therefore, the presence of air gaps laterally adjacent conductors advantageously has the effect of decreasing capacitive coupling between adjacent conductors. An integrated circuit produced by the method hereof thus may experience less current flow to unwanted places through conductors having an electric field induced by adjacent conductors. Such integrated circuits may consequently possess improved reliability and reduced opportunity for circuit failure. Microprocessors employing such integrated circuits may exhibit increased speed performance. Additionally, reducing capacitive coupling by the addition of air gaps may provide for increased integration density within an integrated circuit.

BRIEF DESCRIPTION OF THE DRAWINGS

Other objects and advantages of the invention will become apparent upon reading the following detailed description and upon reference to the accompanying drawings in which.

Figure 1:
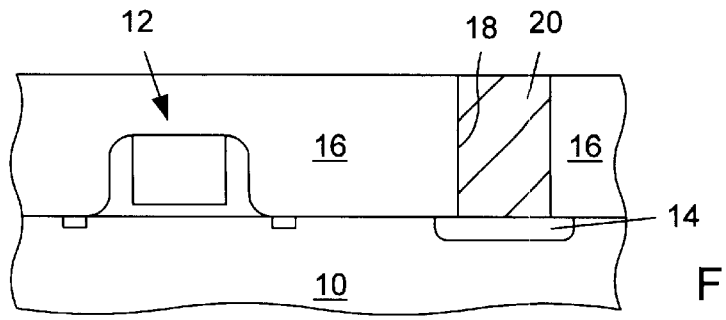
FIG. 1 is a cross-sectional view of an interlevel dielectric disposed upon a semiconductor topography, wherein a conductive plug is arranged within a via which extends along a localized area commensurate with the thickness of the interlevel dielectric.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Turning now to the drawings, FIG. 1 illustrates a cross-section of a semiconductor topography 10 having features formed upon and within topography 10. Those features may include doped conductive regions or conductive layers. According to one embodiment, topography 10 includes a silicon-based substrate having a transistor 12 and a junction 14.

Deposited upon topography 10 is an interlevel dielectric 16. Dielectric 16 prevents electrical coupling between features arranged within and/or upon topography 10 and conductors configured upon dielectric 16 except in the region of via 18. Interlevel dielectric 16 is composed of silicon dioxide but may comprise other insulating materials as well. Various methods may be used to form interlevel dielectric 16, including deposition of an oxide- or glass-based material. Via 18 is formed vertically through interlevel dielectric 16 by selectively etching a portion of interlevel dielectric 16 not covered by a photoresist patterned upon interlevel dielectric 16. A plasma etch routine can be used to form the vertical sidewall surfaces. For example, the plasma etch may be performed in a parallel plate reactor using an ion-assisted reactant. A conductive plug 20 fills via 18 to form an electrical path to junction 14. Tungsten is a common metal used to form conductive plugs. Conductive plug 20 may be formed, e.g., by blanket depositing tungsten upon topography 10 and removing portions of the tungsten layer exclusive of via 18 by, for example, chemical-mechanical polishing. Polishing the plug fill material also helps planarize the surface to form elevationally equivalent surfaces for conductive plug 20 and interlevel dielectric 16.

Figure 2:
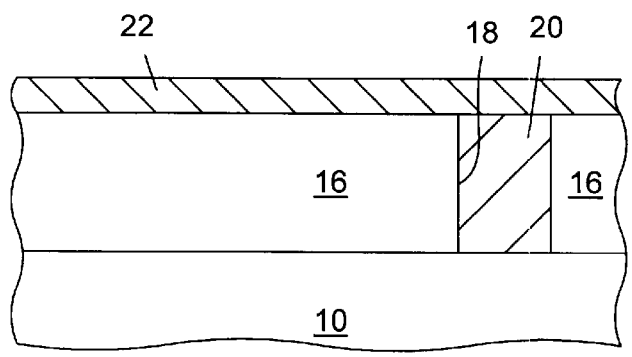
FIG. 2 is a cross-sectional view of the semiconductor topography, wherein a conductive material is blanket deposited across the entire interlevel dielectric and plug surfaces, subsequent to the step of FIG. 1.
Figure 3:
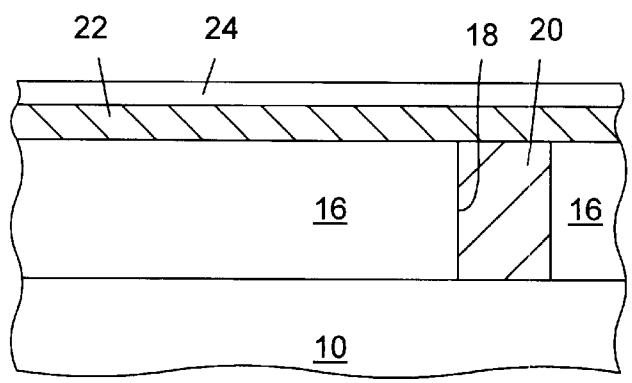
FIG. 3 is a cross-sectional view of the semiconductor topography, wherein a masking layer is deposited across the conductive material, subsequent to the step of FIG. 2.

As shown in FIG. 2, conductive layer 22 is deposited across the upper surfaces of interlevel dielectric 16 and conductive plug 20. Conductive layer 22 preferably comprises aluminum; however, conductive layer 22 may comprise other metals, such as copper, with or without aluminum. Conductive layer 22 may be deposited using physical vapor deposition, e.g., using an aluminum target to sputter the conductive material, or it may be deposited using chemical vapor deposition ("CVD"). FIG. 3 depicts the formation of a masking layer 24 on conductive layer 22. Masking layer 24 may comprise a silicon nitride ("nitride") layer CVD-deposited from, e.g., a silane- and ammonia-bearing plasma.

Figure 4:
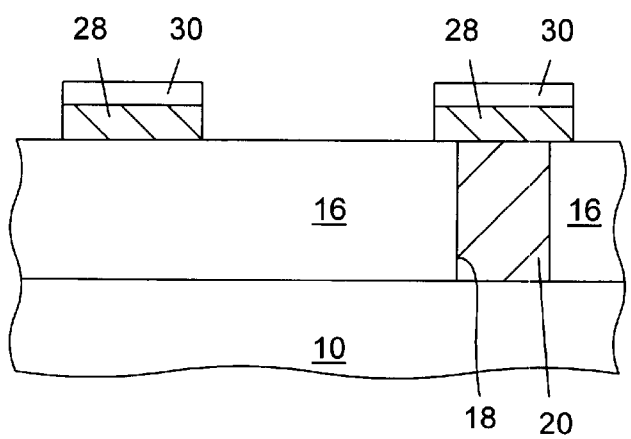
FIG. 4 is a cross-sectional view of the semiconductor topography, wherein portions of the masking layer and conductive material are removed to define masking structures overlying conductors, subsequent to the step of FIG. 3.

Select portions of conductive layer 22 and masking layer 24 may be removed using photoresist, optical lithography, and an etch technique (wet etch or dry plasma etch), thereby forming conductors 28 a spaced distance apart, as shown in FIG. 4. Conductors 28 are configured underneath masking structures 30. For example, one conductor may contact plug 20. The sidewalls of the conductors 28 and overlying masking structures 30 are substantially perpendicular to the surface of the underlying interlevel dielectric 16. Conductor 28 formed above plug 20 is of sufficient width that the conductor 28 extend laterally beyond plug 20 upper surface and onto the interlevel dielectric 16.

Figure 5:
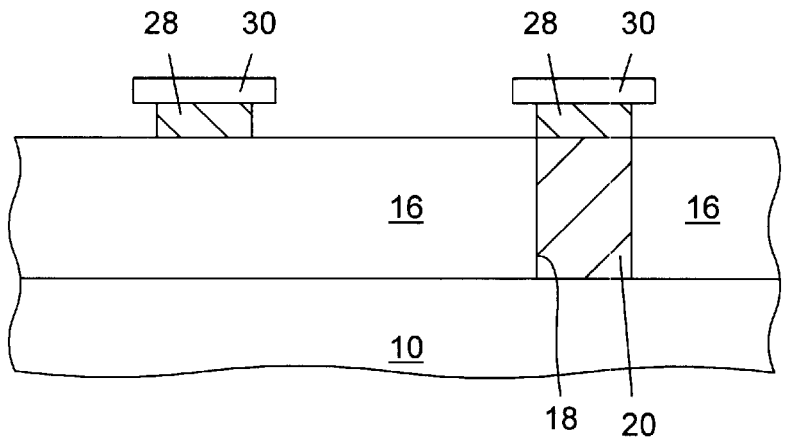
FIG. 5 is a cross-sectional view of the semiconductor topography, wherein the conductors are isotropically etched to form undercut regions underneath the masking structures, subsequent to the step of FIG. 4.

Subsequently, an isotropic etch may be performed on exposed lateral surfaces of conductors 28 such that the conductors are selectively narrowed to a pre-determined lateral thickness, as shown in FIG. 5. The isotropic etch technique preferably involves using a wet etchant that exhibits high selectivity for the conductive material such that conductors 28 may be etched without significant etching of the overlying masking structures 30. While masking structures 30 are preferably composed of nitride, they may be composed of any material that is resistant to attack by etchants that are highly selective for conductors 28. For example, masking structures 30 may alternately comprise silicon dioxide or silicon oxynitride. A photoresist masking layer may be optically patterned above masking structures 30 prior to the isotropic etch to define the regions of conductors 28 to be removed. In an alternative embodiment of the invention, a single isotropic etch exhibiting high selectivity for the conductive material may be used to form conductors 28 with narrowed sidewalls underlying masking structures 30 as shown in FIG. 5. In such an embodiment, FIG. 4 depicts an intermediate step in fabricating the structures depicted in FIG. 5 from the structure depicted in FIG. 3.

Figure 6:
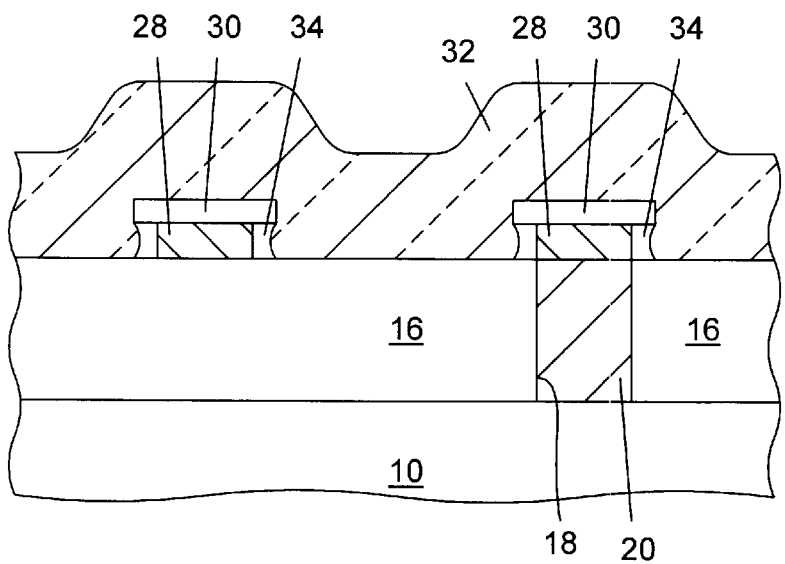
FIG. 6 is a cross-sectional view of the semiconductor topography, wherein an interlevel dielectric is deposited across the semiconductor topography such that air gaps are formed adjacent to the sidewall surfaces of the conductors, subsequent to the step of FIG. 5.
Figure 7:
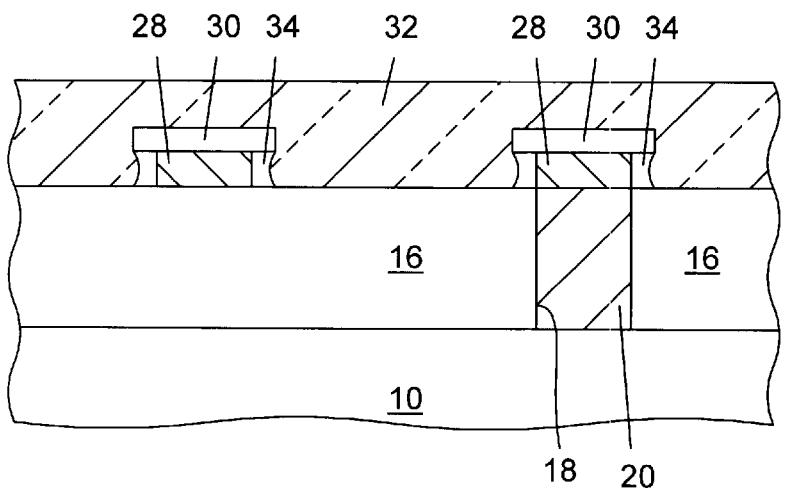
FIG. 7 is a cross-sectional view of the semiconductor topography, wherein the interlevel dielectric is planarized.

Turning to FIG. 6, an interlevel dielectric 32 may be CVD deposited from, e.g., a silane or TEOS source across exposed surfaces of the semiconductor topography. The presence of masking structures 30 above conductors 28 prevents the accumulation of dielectric material upon the sidewall surfaces of conductors 28. As a result, air gaps 34 may be formed laterally adjacent to conductors 28 underneath the masking structures 30. Because air has the lowest dielectric constant of any material (i.e., κ=1.0 for air), the presence of air gaps 34 minimizes the capacitive coupling between adjacent conductors 28. Interlevel dielectric 32 may be removed down to a level spaced above the surfaces of masking structures 30 using, e.g., chemical mechanical polishing, as shown in FIG. 7. The procedures depicted in FIGS. 1–7 may be repeated to form additional interconnect levels overlying interlevel dielectric 32 and separated by additional interlevel dielectrics.

It will be appreciated by those skilled in the art having the benefit of this disclosure that this invention is believed to provide a method for forming integrated circuits in which air gaps are formed laterally adjacent the conductors employed by the integrated circuit to reduce capacitive coupling between adjacent conductors. Further modifications and alternative embodiments of various aspects of the invention will be apparent to those skilled in the art in view of this description. For example, the conductive interconnects may be formed as multi-layer rather than single-layer metal interconnects. It is intended that the following claims be interpreted to embrace all such modifications and changes and, accordingly, the specification and drawings are to be regarded in an illustrative rather than a restrictive sense.

What is claimed is:

1. An integrated circuit, comprising:

a conductor disposed upon a conductive plug, wherein said conductor extends beyond the lateral boundaries of said conductive plug and is arranged upon a first interlevel dielectric, and wherein said conductor comprises opposed sidewall surfaces laterally spaced from a second interlevel dielectric by air gaps; and a masking structure arranged upon said conductor, said masking structure comprising opposed ends which extend beyond said opposed sidewall surfaces of the conductor over said air gaps.

2. The integrated circuit of claim 1, further comprising a via extending through the first interlevel dielectric to a junction region of an underlying semiconductor topography, wherein said conductive plug, abutting said conductor and said junction region, is bounded within said via.

3. The integrated circuit of claim 1 wherein said masking structure comprises a material selected from the group consisting of silicon dioxide, silicon nitride and silicon oxynitride.

4. The integrated circuit of claim 1 wherein said masking structure is dissimilar in composition from said conductor.

5. The integrated circuit of claim 1 wherein said conductor comprises a metal, and wherein said masking structure is adapted to be preferentially retained during isotropic etching of said conductor.

6. The integrated circuit of claim 1 wherein a substantially planar surface of said second interlevel dielectric is spaced above said masking structure.

7. The integrated circuit of claim 1 wherein said conductive plug comprises a conductive material.

8. The integrated circuit of claim 2 wherein said junction region comprises dopants implanted into the junction region.

* * * * *